United States Patent
Gassenq et al.

(10) Patent No.: US 9,774,167 B2
(45) Date of Patent: Sep. 26, 2017

(54) METHOD OF PRODUCTION OF A SEMICONDUCTING STRUCTURE COMPRISING A STRAINED PORTION

(71) Applicant: Commissariat a l'energie atomique et aux energies alternatives, Paris (FR)

(72) Inventors: Alban Gassenq, Saint-Hilaire (FR); Vincent Reboud, Paris (FR); Kevin Guilloy, Grenoble (FR); Vincent Calvo, Fontaine (FR); Alexei Tchelnokov, Meylan (FR)

(73) Assignee: Commissariat A l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/281,785

(22) Filed: Sep. 30, 2016

(65) Prior Publication Data
US 2017/0093130 A1    Mar. 30, 2017

(30) Foreign Application Priority Data

Sep. 30, 2015  (FR) ...................................... 15 59283

(51) Int. Cl.
*H01L 21/70*     (2006.01)
*H01L 21/02*     (2006.01)
(Continued)

(52) U.S. Cl.
CPC ........ *H01S 5/3201* (2013.01); *H01L 21/0245* (2013.01); *H01L 21/02532* (2013.01);
(Continued)

(58) Field of Classification Search
CPC ......... H01L 33/28; H01L 33/26; H01L 33/20; H01L 33/105; H01L 33/0095;
(Continued)

(56) References Cited

U.S. PATENT DOCUMENTS 7,759,233 B2 *  7/2010  Forbes .................. H01L 29/045
                                                    438/584
8,039,370 B2 * 10/2011  Bordel ................ H01L 21/2007
                                                    257/E33.025
(Continued)

FOREIGN PATENT DOCUMENTS

WO    WO 2010/094030 A1    8/2010

OTHER PUBLICATIONS

M.J. Suess, et al., "Analysis of enhanced light emission from highly strained germanium microbridges", Nature Photonics, vol. 7, 2013, 7 pgs.
(Continued)

*Primary Examiner* — Marvin Payen
*Assistant Examiner* — Jeremy Joy
(74) *Attorney, Agent, or Firm* — Oblon, McClelland, Maier & Neustadt, L.L.P.

(57) ABSTRACT

A method of production of a semiconducting structure including a strained portion tied to a support layer by molecular bonding, including the steps in which a cavity is produced situated under a structured part so as to strain a central portion by lateral portions, and the structured part is placed in contact and molecularly bonded with a support layer, wherein a consolidation annealing is performed, and a distal part of the lateral portions in relation to the strained portion is etched.

15 Claims, 8 Drawing Sheets

(51) Int. Cl.
*H01L 33/00* (2010.01)
*H01S 5/32* (2006.01)
*H01S 5/12* (2006.01)
*H01L 33/10* (2010.01)
*H01L 33/26* (2010.01)
*H01L 29/78* (2006.01)
*H01L 29/10* (2006.01)
*H01L 33/20* (2010.01)
*H01L 21/8234* (2006.01)

(52) U.S. Cl.
CPC .. *H01L 21/823412* (2013.01); *H01L 29/1054* (2013.01); *H01L 29/7842* (2013.01); *H01L 33/0008* (2013.01); *H01L 33/0012* (2013.01); *H01L 33/0054* (2013.01); *H01L 33/0095* (2013.01); *H01L 33/105* (2013.01); *H01L 33/20* (2013.01); *H01L 33/26* (2013.01); *H01S 5/12* (2013.01); *H01S 5/3223* (2013.01); *H01L 2924/01032* (2013.01); *H01L 2924/3511* (2013.01)

(58) Field of Classification Search
CPC ............. H01L 33/0054; H01L 33/0012; H01L 21/823807; H01L 21/02532; H01L 21/02381; H01L 21/0245; H01L 21/823412; H01L 29/7842; H01L 29/1054; H01L 2924/3511; H01L 2924/01032; H01S 5/3201; H01S 5/3223

See application file for complete search history.

(56) References Cited

U.S. PATENT DOCUMENTS

| | | | | |
|---|---|---|---|---|
| 2003/0168659 | A1* | 9/2003 | Lal | B81C 1/00666 257/49 |
| 2004/0173798 | A1* | 9/2004 | Forbes | H01L 21/0262 257/69 |
| 2004/0224480 | A1* | 11/2004 | Forbes | H01L 21/76254 438/455 |
| 2006/0094175 | A1* | 5/2006 | Cohen | H01L 24/26 438/190 |
| 2006/0134893 | A1* | 6/2006 | Savage | H01L 21/6835 438/483 |
| 2008/0029832 | A1* | 2/2008 | Forbes | H01L 21/823807 257/408 |
| 2010/0207254 | A1 | 8/2010 | Jain et al. | |
| 2011/0059598 | A1* | 3/2011 | Saracco | B82Y 10/00 438/479 |
| 2013/0202005 | A1 | 8/2013 | Dutt | |

OTHER PUBLICATIONS

David S. Sukhdeo, et al., "Direct bandgap germanium-on-silicon inferred from 5.7% (100) uniaxial tensile strain (Invited)", Photon. Res., vol. 2, (3), 2014, 6 pgs.

Donguk Nam, et al., "Study of Carrier Statistics in Uniaxially Strained Ge for a Low-Threshold Ge Laser", IEEE Journal of Selected Topics in Quantum Electronics, vol. 20, (4), 2014, 7 pgs.

Donguk Nam, et al., "Strain-Induced Pseudoheterostructure Nanowires Confining Carriers at Room Temperature with Nanoscale-Tunable Band Profiles", Nano Letters, 2013, 6 pgs.

B. Ben Bakir, et al., "Electrically driven hybrid Si/III-V Fabry-Perot lasers based on adiabatic mode transformers", Optics Express, vol. 19, (11), 2011, 9 pgs.

Vincent Reboud, et al., "Structural and optical properties of 200 mm germanium-on-insulator (GeOI) substrates for silicon photonics applications", Proceedings of SPIE—The International Society for Optical Engineering 9367, 2015, 7 pgs.

French Preliminary Search Report (with Written Opinion) issued Aug. 2, 2016 in French Application 15 59283 filed on Sep. 30, 2015 (with English Translation of Categories of Cited Documents).

Cicek Boztug, et al., "Grating-coupled mid-infrared light emission from tensilely strained germanium nanomembranes", Applied Physics Letters 103, 2013, 5 pgs.

Rodolfo E. Camacho-Aguilera, et al., "An electrically pumped germanium laser", Optics Express, vol. 20, (10), 2012, 5 pgs.

* cited by examiner

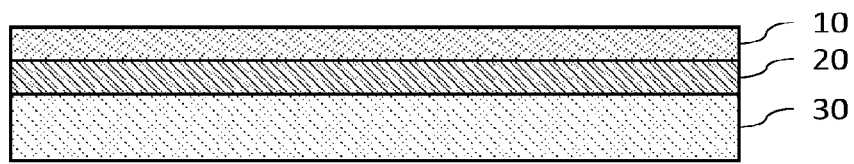
Fig.5a
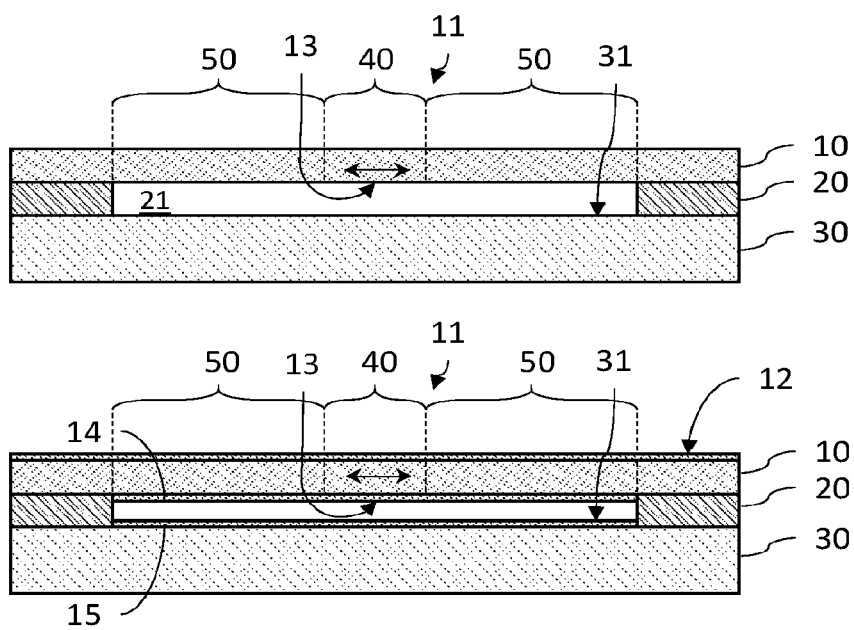
Fig.5b
Fig.5c
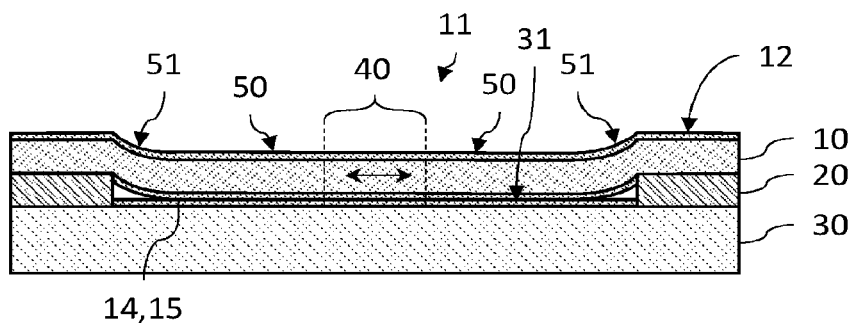
Fig.5d
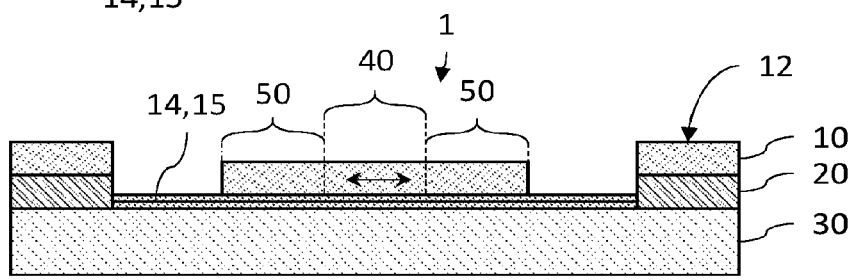
Fig.5e

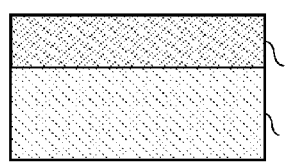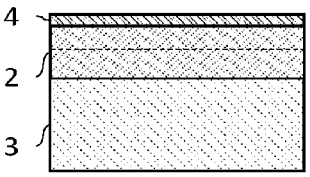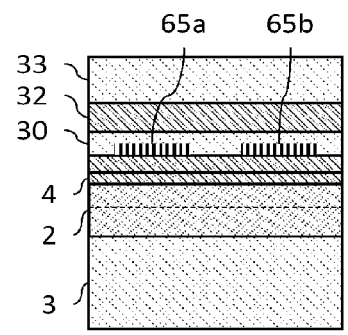
Fig.10a  Fig.10b  Fig.10c
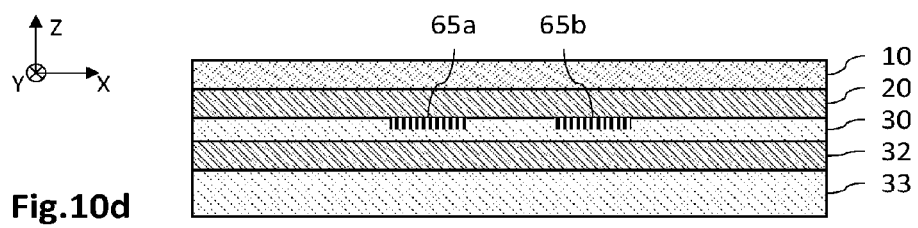
Fig.10d
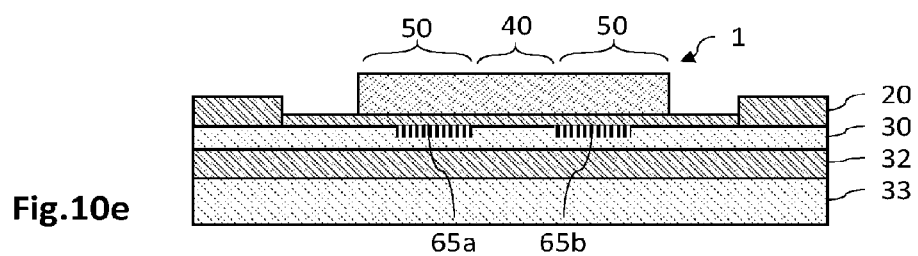
Fig.10e
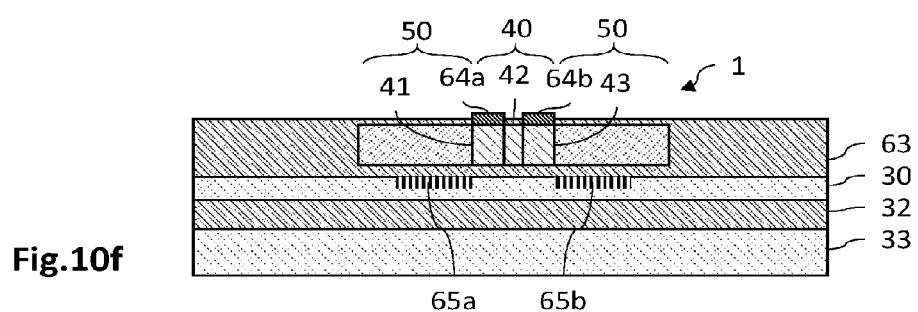
Fig.10f

METHOD OF PRODUCTION OF A SEMICONDUCTING STRUCTURE COMPRISING A STRAINED PORTION

TECHNICAL FIELD

The field of the invention is that of the production of a semiconducting structure, comprising a strained portion, tied to a support layer by molecular bonding. The invention applies in particular to the production of an optoelectronic device able to emit or receive light and comprising a semiconducting structure such as this with strained portion. The optoelectronic device can be, by way of illustration, a laser source whose gain medium is formed of a portion of strained germanium, disposed on a silicon-based photonic circuit.

STATE OF THE PRIOR ART

In diverse electronic or optoelectronic applications, it may be advantageous to use a layer of a strained monocrystalline material, such as a layer of silicon, of germanium silicon, of tin germanium, or indeed of germanium. Such is the case in particular for high-performance transistors where the strain undergone by a material is manifested by an increase in the speed of displacement of the charge carriers, thereby improving the performance of such a transistor. Such is the case also for certain light sources, the material of whose emissive layer exhibits, unstrained, an indirect energy band structure, the band structure then being rendered substantially direct by the application of an appropriate strain.

The article by Sukhdeo et al. entitled *Direct bandgap germanium-on-silicon inferred from 5.7% <100>uniaxial tensile strain*, Photon. Vol. 2, No. 3, A8, 2014 describes an example of a structured part of a semiconducting layer suitable for emitting light, the structured part comprising a strained germanium portion suspended above a silicon support layer. The structured part also comprises lateral portions, or tensioner arms, linking the strained portion to a peripheral part of the semiconducting layer, and ensuring the tensioning of the strained portion.

The method for producing a structured part such as this of the semiconducting layer consists firstly in obtaining a substrate of GOI (for Germanium On Insulator) type where a semiconducting layer of monocrystalline germanium, produced previously by epitaxy, is bonded to a sacrificial silicon oxide layer which extends over a silicon support layer. The germanium semiconducting layer exhibits, at ambient temperature, a residual tensile strain manifested by a deformation of the crystal lattice of the germanium of the order of 0.2%. The germanium layer is thereafter structured in such a way as to form a central portion in the form of a wire linked to a peripheral part of the germanium layer by two lateral portions, also called tensioner arms, arranged mutually in such a way as to generate a uniaxial tensile strain in the central portion. A cavity is thereafter produced under the structured part by etching of the sacrificial layer so as to render free the surface of the support layer situated facing the structured part. A suspended membrane is thus obtained in which the lateral portions induce a tensile strain in the central part, inducing a uniaxial deformation of the order of 5.7%, reducing, or indeed reversing, the disparity between the direct and indirect forbidden bands. With the aim of ensuring thermal contact between the strained portion and the support layer, the structured part is placed in contact with the free surface of the support layer.

However, a need exists to produce a semiconducting structure on the basis of the structured part of the semiconducting layer, that is to say a semiconducting structure which can be individualized, that is to say separated from the peripheral part of the semiconducting layer, without its mechanical resilience and therefore its electronic and/or optical properties being degraded. A need also exists to obtain a semiconducting structure which can support conventional subsequent microelectronics steps, such as steps of layer deposition, of lithography and of etching. Finally, a need exists to be able to produce in a collective and simultaneous manner a plurality of mutually distinct and adjacent semiconducting structures.

DISCLOSURE OF THE INVENTION

The objective of the invention is to remedy at least in part the drawbacks of the prior art, and more particularly to propose a method of production of a semiconducting structure comprising a strained portion bonded to a support layer. Hence, the subject of the invention is a method of production of a semiconducting structure comprising a strained portion tied to a support layer by molecular bonding, comprising the steps of:

i. providing a stack formed of a semiconducting layer covering a sacrificial layer disposed on a support layer;

ii. structuring the semiconducting layer in such a way as to form a structured part and a peripheral part, the structured part comprising a central portion linked to the peripheral part by at least two lateral portions opposite one another in relation to the central portion;

iii. producing a cavity situated under the structured part, by etching of the sacrificial layer, so as to render free a surface of the support layer situated at the level of the cavity and to strain the central portion, termed the strained portion, by the lateral portions, and placing the structured part in contact with said free surface so as to bind the structured part of said free surface by molecular bonding;

iv. determining a minimum value of molecular bonding energy of the structured part on the support layer, together with a minimum value of bonded area of the lateral portions on the support layer, these minimum values being such that said molecular bonding energy is greater than an elastic energy of the structured part;

v. performing a consolidation annealing at an annealing temperature such that the molecular bonding energy exhibits a value greater than or equal to said previously determined minimum value;

vi. etching a distal part of the lateral portions in relation to the strained portion, so that the bonded area of the lateral portions exhibits a value greater than or equal to said previously determined minimum value, thus obtaining said semiconducting structure.

Certain preferred but nonlimiting aspects of this method of production are the following:

The etching of the sacrificial layer during the production of the cavity is understood to be a partial, and non-total, etching of the sacrificial layer, through openings formed in the semiconducting layer during the production of the structured part. More precisely, the part of the sacrificial layer situated under the structured part is etched.

During step vi, it is possible to etch a distal part of the lateral portions joining with the peripheral part of the semiconducting layer.

Subsequent to step vi, the semiconducting structure can exhibit a substantially plane upper face opposite to the support layer.

The semiconducting layer comprising a material exhibiting, unstrained, an indirect energy band structure, it is possible to structure the lateral portions during step ii so that, during step iii, the strained portion exhibits a deformation such that the material forming the strained portion has a substantially direct energy band structure.

The method can comprise the following steps of:
prior to step i) of providing the stack, estimating a minimum tensile strain value from which the semiconducting layer exhibits a direct energy band structure;
providing said stack, the semiconducting layer exhibiting a lower initial value than said minimum value;
determinating the structuring so that, after step iii) of producing the cavity, the central portion of the structured part exhibits a final tensile strain value greater than or equal to said minimum value and therefore a direct energy band structure.

During the provision of said stack, the semiconducting layer can exhibit a tensile strain of a non-zero initial value. Moreover, during the structuring step, the lateral portions of the structured part can exhibit a greater average width than an average width of the central portion. Thus, during the production of the cavity, the central portion can exhibit a final strain value that is greater than the initial value.

During step iii, it is possible to produce the cavity and to effect contact by HF vapor-phase etching optionally followed by the deposition and then the evaporation of a liquid at the level of the cavity, and in which during step v the annealing temperature is substantially greater than or equal to 200° C.

During step iii, it is possible to carry out an oxidation or a nitriding of said free surface and of a surface of the structured part oriented toward the free surface, and in which, during step v the annealing temperature is substantially greater than or equal to 100° C.

A dielectric layer arising from said oxidation or nitriding can be formed at the interface between the structured part and the support layer, whose thickness is preferably greater than or equal to 10 nm.

During step ii, it is possible to structure the lateral portions so that, during step iii, the strained portion exhibits a uniaxial or biaxial deformation.

The strained portion can comprise at least one doped part with a doping level of greater than or equal to $2.10^{18}$ cm$^{-3}$.

It is possible to produce at least one reinforcement element situated at the level of the strained portion, said reinforcement element comprising a material distinct from the material forming the strained portion, and extending over the entire thickness of the strained portion and in a part of the support layer.

The invention also pertains to a method of collective production of a plurality of mutually distinct and adjacent semiconducting structures, in which said semiconducting structures are produced in a simultaneous manner by the method of production according to any one of the previous characteristics, and in which each semiconducting structure is separated from the corresponding peripheral part.

The invention also pertains to a method for producing an optoelectronic device, said device comprising a semiconducting structure obtained by the method according to any one of the previous characteristics, in which a PN or PIN junction is produced in the strained portion, the junction extending in a manner substantially orthogonal or parallel to the plane of the support layer.

It is possible to produce an optical cavity in which is situated at least one part of the strained portion whose material is suitable for forming a gain medium, the device obtained being suitable for emitting a coherent light beam.

It is possible to produce at least two reflector optical elements suitable for forming the optical cavity, the optical elements being disposed at the level of an upper face of the semiconducting structure opposite to the support layer.

It is possible to produce at least two reflector optical elements suitable for forming the optical cavity, the optical elements being disposed at the level of the free surface of the support layer.

BRIEF DESCRIPTION OF THE DRAWINGS

Other aspects, aims, advantages and characteristics of the invention will be better apparent on reading the following detailed description of preferred embodiments of the latter, given by way of nonlimiting example and with reference to the appended drawings in which:

FIGS. 5a to 5e illustrate, in a schematic manner and in sectional view, various steps of a method of production of a semiconducting structure with strained portion, bonded to a support layer by hydrophilic molecular adhesion;

FIGS. 7a and 7c represent various steps of producing the structure in sectional view;

FIGS. 10a to 10f illustrate in a schematic manner and in sectional view various steps of a method for producing an optoelectronic device comprising a semiconducting structure obtained by the method according to the invention, the optoelectronic device here being a laser source where an optical cavity is produced in the support layer;

DETAILED DESCRIPTION OF PARTICULAR EMBODIMENTS

Figure 1A:
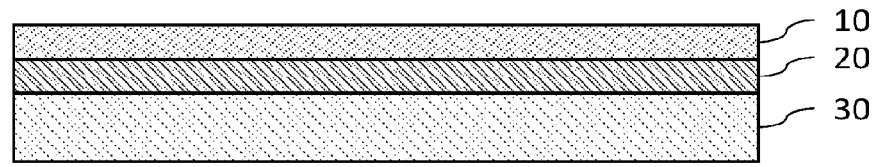
FIGS. 1a to 1d illustrate, in a schematic manner and in sectional view, various steps of a method of production of a semiconducting structure with strained portion, bonded to a support layer by hydrophobic molecular adhesion.

In the figures and in the subsequent description, the same references represent identical or similar elements. Moreover, the various elements are not represented to scale so as to enhance the clarity of the figures.

The invention relates in a general manner to a method for producing a semiconducting structure, comprising a strained portion based on a monocrystalline material, tied by direct bonding to a surface of a support layer.

The semiconducting structure is advantageously produced based on a monocrystalline semiconducting material whose energy band structure is indirect when the material is unstrained or relaxed, that is to say the maximum of the valence band and the minimum of the conduction band do not correspond to the same value of the wave vector. The material of the strained portion of the semiconducting structure can then exhibit a deformation of its crystal lattice that is sufficient to render the band structure substantially direct. Substantially direct band structure is understood to mean that the energy difference between the minimum of the Γ valley (or direct valley) and the minimum of the L valley (or indirect valley) of the conduction band is of the order of magnitude or less than kT, where k is Boltzmann's constant and T the temperature of the material. Stated otherwise, direct or substantially direct band structure is understood to mean that the energy minimum of the L valley (or indirect valley) is higher than or substantially equal to the energy minimum of the Γ valley (or direct valley) of the conduction band: $\Delta E = E_{min,L} - E_{min,\Gamma} \geq 0$. Substantially equal is understood to mean here that this energy difference is of the order of magnitude or less than kT, where k is Boltzmann's constant and T the temperature of the material.

A preferred embodiment of the invention pertains more particularly to a monocrystalline germanium semiconducting structure comprising a tensile-strained portion whose deformation is sufficient to exhibit a substantially direct band structure, the semiconducting structure being bonded by molecular adhesion to the surface of a silicon support layer.

Strained portion is understood to mean a portion made of a monocrystalline semiconducting material exhibiting a tensile or compressive mechanical strain, giving rise to a deformation of the cells of the crystal lattice of the semiconducting material. The strained portion then exhibits an elastic energy Ee, which, to first order, can be written: $Ee \sim E.\epsilon^2.V$, where E is the Young's modulus of the semiconducting material which depends in particular on the uniaxial or biaxial, or indeed multiaxial, character of the deformation of the material as well as on the crystal axis of the deformation, $\epsilon$ the average deformation undergone by the material, and V the volume of the portion. Within the framework of the invention, the strained portion exhibits here a tensile strain, in the sense that the value of the lattice constant of the crystal lattice is greater than its normal value when the material is unstrained or relaxed. The layer is strained in tension when it undergoes a mechanical strain which tends to stretch the cells of the crystal lattice in the plane of the layer. This is manifested by the presence of a compressive strain of the cells of the crystal lattice which is oriented along an axis substantially orthogonal to the plane of stretch, that is to say to the plane of the layer.

Direct bonding, also called molecular bonding or bonding by molecular adhesion, is understood to mean the tying of two surfaces of identical or different materials one against the other without the introduction of any adhesive layer (of adhesive, glue type etc . . . ) but by way of the attractive forces of atomic or molecular interaction between the surfaces to be bonded, for example Van der Walls forces, hydrogen bonds, or indeed covalent bonds. The semiconducting structure then exhibits a bonding energy which, to first order, can be written: Ec~Es.S, where $E_s$ is the bonding energy per unit area (it is assumed here that the surfaces to be bonded exhibit substantially equal surface energies) and S the area of the bonded surfaces.

As is detailed subsequently, the molecular bonding implemented here can be of hydrophilic or hydrophobic type. The bonding is of hydrophilic type when it relates to the adhesion of hydrophilic surfaces, that is to say of surfaces having the capacity to bind with water molecules through an adsorption mechanism. The bonding then involves hydrogen bond forces, the interaction intensity of which is particularly high. Hence, hydrophilic surfaces are terminated in hydroxyl groups (—OH). Alternatively, the bonding can be of hydrophobic type and then relate to surfaces which do not have the capacity to adsorb water. Hence, hydrophobic surfaces can be saturated with atoms such as hydrogen or fluorine.

A method for producing a semiconducting structure, comprising a portion of strained monocrystalline germanium, bonded by molecular adhesion to a silicon support layer is described subsequently, by way of illustration. However, in a general manner, the material of the semiconducting structure is monocrystalline and can be chosen from among the elements of column IV of the periodic table, such as silicon, germanium, tin in its semiconducting phase, and alloys formed of these elements such as SiGe, GeSn, SiGeSn. It can also be chosen from among alloys comprising elements of columns III and V of the periodic table. Moreover, the material of the support layer can be chosen from among silicon, sapphire, borosilicate, silica, glass, quartz or any other material suitable for being bonded by molecular adhesion to the material of the semiconducting structure. Finally, the material of the sacrificial layer can be chosen from among silicon, an oxide or a nitride, for example of silicon.

FIGS. 1a to 1d are sectional views illustrating various steps of a method of production of a semiconducting structure comprising a strained germanium portion tied by direct bonding to a silicon support layer, according to a first embodiment.

FIG. 1a and the following figures are oriented according to an orthonormal frame (X,Y,Z) where X and Y are the horizontal axes defining a plane parallel to the planes along which the various layers extend, and where Z is the vertical axis along which the thickness of the layers is defined. The terms "up/down", "lower/upper" are defined along the vertical axis Z.

According to a first step illustrated in FIG. 1a, a stack is produced formed of a semiconducting layer 10, comprising a structured part (not represented), tied to a support layer 30 by way of a sacrificial layer 20.

Initially, the stack is produced in the form of a GOI (for Germanium On Isulator) substrate, that is to say of a semiconducting layer 10 of germanium covering a sacrificial layer 20 of silicon oxide resting here on a silicon support layer 30. This stack is preferably produced by means of the method described in the publication by Reboud et al. entitled *Structural and optical properties of* 200 *mm germanium-on-insulator (GeOI) substrates for silicon photonics appli-* cations, Proc. SPIE 9367, Silicon Photonics X, 936714 (Feb. 27, 2015) which implements in particular the Smart Cut™ technology.

More precisely, the epitaxial growth of a semiconducting layer of crystalline germanium on a thick silicon layer is performed firstly. The germanium layer then exhibits, at ambient temperature, a tensile residual deformation of the order of 0.2%. A dielectric layer, for example a silicon oxide, is thereafter deposited on the free surface of the germanium layer, and then an implantation of H$^+$ ions is performed in the germanium layer. Thereafter, the dielectric layer covering the germanium layer is tied with a handle substrate formed of a dielectric layer covering a silicon layer. The germanium layer is separated into two parts at the level of a zone which is embrittled by the ion implantation. A monocrystalline semiconducting layer 10 of germanium covering a sacrificial layer 20, here silicon oxide, is thus obtained which rests on a support layer 30, for example a silicon layer of an SOI substrate. The free surface of the germanium layer can thereafter be cleaned by reactive ion etching (or RIE etching) optionally followed by chemical mechanical polishing (CMP).

Alternatively, it is possible to produce the stack by epitaxial growth of a germanium layer on a substrate, the germanium layer thereafter being covered with a silicon oxide layer. This stack is tied by molecular bonding to a second stack formed of a silicon layer covered with a silicon oxide layer, the bonding being carried out by placing the silicon oxide layers in mutual contact. The substrate is thereafter totally eliminated, for example by grinding, so as to thus obtain the germanium semiconducting layer bound to a silicon support layer by a sacrificial silicon oxide layer. This approach is in particular described in the publication by Jan et al. entitled *Tensile-strained germanium-on-insulator substrate for silicon-compatible optoelectronics*, Opt. Mater. Express 1, 1121-1126 (2011).

The germanium semiconducting layer can exhibit, according to the electronic or optoelectronic applications envisaged, a thickness of the order of a few tens of nanometers to a few microns. The sacrificial layer can exhibit a thickness of the order of a few tens of nanometers to a few microns. The support layer can exhibit a thickness of a few tens of nanometers to a few microns.

The production of the semiconducting layer 10 of desired thickness by means of the method described in the publication by Reboud et al. 2015 is particularly advantageous insofar as the crystalline quality of the semiconducting layer 10 is particularly high and substantially homogeneous along the thickness of the layer. By way of example, the density of dislocations can be less than $10^7$ cm$^{-2}$ over the entire thickness of the layer, in particular at the level of the interface with the sacrificial layer 20.

The semiconducting layer 10 exhibits a non-zero tensile strain, that is to say that the strain of the semiconducting layer, in the plane XY of the layer, exhibits a non-zero and positive initial value $\sigma_{pc}^i$. Here, the initial value $\sigma_{pc}^i$ of strain of the semiconducting layer 10 might not be sufficient for the band structure to be direct, stated otherwise $\Delta E<0$.

Subsequently, the semiconducting layer 10 is structured in such a way that it exhibits a structured part 11 surrounded by a peripheral part 12, the structured part 11 comprising a central portion 40 and lateral portions 50 which link the central portion to the peripheral part 12 (cf. for example FIG. 1b, 2a or 3a). The structured part 11 is produced by conventional steps of optical and/or electron lithography and then of etching the semiconducting layer 10, which are therefore not detailed here.

Figure 2A:
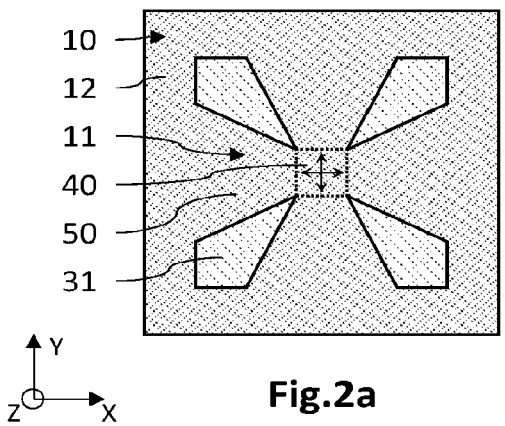
FIG. 2a illustrates in a schematic manner and viewed from above a structured part bonded on a support layer and comprising a strained portion undergoing a biaxial deformation.
Figure 3A:
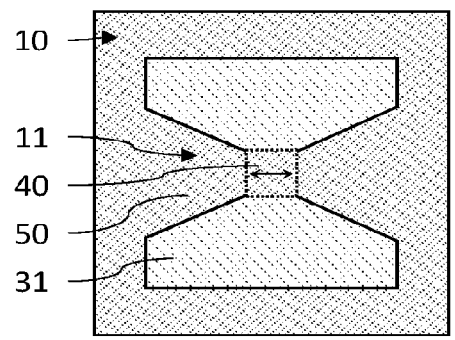
FIG. 3a illustrates in a schematic manner and viewed from above a structured part bonded on a support layer and comprising a strained portion undergoing a uniaxial deformation.

As illustrated in FIG. 2a or 3a which illustrate examples of patterns formed by the structured part 11 of the semiconducting layer 10, the central portion 40 can exhibit a substantially square or rectangular shape, in the plane (X,Y), of a few hundreds of nanometers to a few microns along a side. Other shapes are possible, such as elongate or indeed polygonal shapes.

At least two lateral portions 50 are produced which each link a boundary of the central portion 40 to the peripheral part 12. They are arranged pairwise in relation to the central portion 40 in such a way as to define at least one substantially rectilinear deformation axis. In the example of FIG. 2a, two pairs of lateral portions 50 are represented where the latter each extend to part of a boundary of the central portion 40 of substantially square shape as far as the peripheral part 12. The lateral portions 50 are arranged pairwise in such a way as to thus define here two mutually secant deformation axes at the level of the central portion 40. Thus, a biaxial deformation of the central portion 40, oriented along the two deformation axes, will be able to be generated when the structured part 11 is suspended during a subsequent step. In the example of FIG. 3a, a single pair of lateral portions 50 is represented where the latter are arranged in such a way as to define a single deformation axis of the central portion 40. Thus, a uniaxial deformation will be able to be generated in the central portion 40 during a subsequent step.

The central portion 40 is intended to become a tensile-strained portion exhibiting a deformation of its crystal lattice, that is to say here an increase in its lattice constant, generated by the lateral portions 50. The lateral portions 50 are thus intended to place the central portion 40 under tension, preferably without however themselves undergoing their own mechanical strain, except for the residual strain mentioned previously. Hence, the lateral portions 50, or tensioner arms, and the central portion 40 are formed so that the average width "b" of the tensioner arms 50 is greater than the average width "a" of the central portion 40, preferably ten times greater than the latter. Width is understood to mean the transverse, to its longitudinal axis, dimension of a portion or of an arm, in the plane (X,Y). The central portion 40 here exhibits an average width "a" oriented along the axis Y and substantially constant along the longitudinal axis X. The tensioner arms 50 exhibit an average width "b" oriented here along the axis Y. Furthermore, the surface areal dimension in the plane (X,Y), and in particular the width of each lateral portion 50, that is to say the transverse dimension substantially orthogonal to the deformation axis, is chosen so that the lateral portion 50 exhibits substantially no or little deformation. More precisely, the average deformation, in the thickness of the lateral portion 50, decreases as one moves away from the central portion 40 and becomes negligible at a distance greater than or equal to one or two times the dimension of the central portion 40. The average width of each lateral portion is greater than the average width of the central portion, preferably ten times greater than the latter. The average deformation of the lateral portion 50, that is to say the deformation field integrated in the volume of the lateral portion exhibits a lower value than that of the strained portion, or indeed is negligible in relation to the average deformation in the strained portion. In the examples of FIGS. 2a and 3a, the lateral portions 50 exhibit a trapezium shape so that the width increases as one moves away from the central portion 40. Other shapes are possible, for example a shape similar or identical to that represented in the article by Sukhdeo et al. 2014 mentioned previously, where the lateral portions exhibit an abrupt increase in width in relation to the central portion and then a main zone with constant width.

The structuring can be carried out in such a way as to control the value of the amplification of the tensile strain of the central portion 40 of the semiconducting layer 10, obtained subsequently while producing the cavity. Hence, one predetermines the dimensional parameters of the structured part 11, for example the widths and lengths of the central portion 40 and of the tensioner arms 50. By way of example, in the case of a rectangular central portion 40, of length A and of constant width a, and rectangular tensioner arms 50 of length B/2-A/2 and of constant width b, an amplification factor f linking the final tensile strain $\sigma_{pc}^{f}$ to the initial tensile strain $\sigma_{pc}^{i}$ can be expressed by the following relation formulated in the article by Süess et al entitled *Analysis of enhanced light emission from highly strained germanium microbridges*, Nature Photon. 7, 466-472 (2013):

$$f = \frac{2L+B}{B}\left(1 + \frac{A}{B-A}\right) \Big/ \left(\frac{a}{b} + \frac{A}{B-A}\right)$$

where L is the length of the sacrificial layer 20 eliminated under the structured part 11 during the subsequent step of producing the cavity. Thus, as a function of the dimensional parameters of the structured part 11 of the semiconducting layer 10, it is possible to control the value of the amplification of the tensile strain applied to the central portion 40 during the production of the cavity. The amplification factor can also be estimated by means of numerical simulation software such as COMSOL Multiphysics.

Thus, a locally structured semiconducting layer 10 covering the sacrificial layer 20 is obtained. The semiconducting layer 10 exhibits a structured part 11 comprising a central portion 40 here linked by lateral portions 50 to a peripheral part 12 of the layer 10. The central portion 40 is intended to undergo a tensile strain arising from a deformation generated by the lateral portions 50.

Figure 1B:
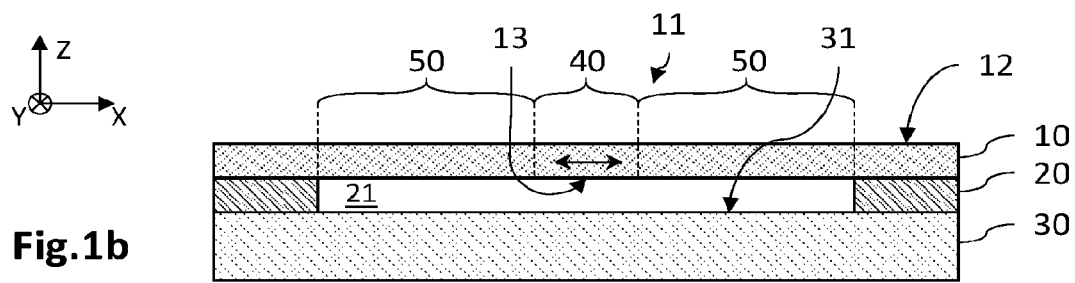
Figure 1C:
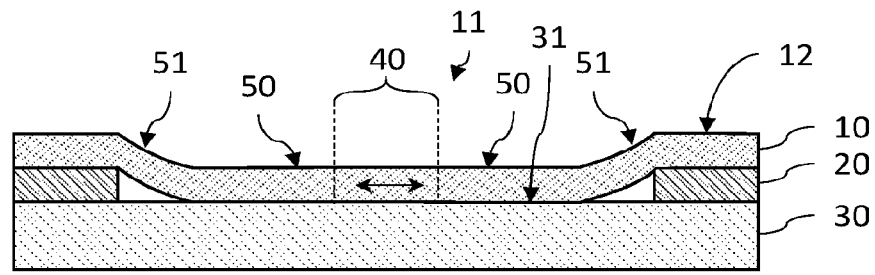

According to a second step illustrated in FIGS. 1b and 1c, a cavity is produced under the structured part of the semiconducting layer so as to suspend it above a surface rendered free of the support layer. Next, the suspended structured part is placed in contact with the free surface of the support layer.

Initially, as illustrated in FIG. 1b, the cavity 21 is produced by wet etching of the sacrificial layer 20 rendered accessible by openings obtained during the structuring of the semiconducting layer 10. Here the wet etching uses hydrofluoric acid (also called HF, for Hydrogen Fluoride) in the vapor phase. The HF vapor flux can be low so as to etch the sacrificial layer at a moderate speed of the order of 10 nm per minute. More precisely, the vapor flux can, by way of example, comprise hydrofluoric acid at 15 torr of partial pressure, alcohol at 0.01 torr and nitrogen at 60 torr. Thus, the part of the sacrificial layer 20 situated under the structured part 11 of the semiconducting layer 10 is etched over its entire thickness. The structured part 11 is then suspended above the rendered free surface 31 of the support layer 30, thus forming a cavity 21. The cavity 21 is therefore situated between the structured part 11 and the free surface 31 of the support layer 30.

A suspended structured part 11 is thus obtained, which takes the form of a suspended membrane, whose lateral portions 50 now form tensioner arms which maintain the central portion 40 above the free surface 31 of the support layer 30 and generate in the central portion 40 a tensile mechanical strain oriented along the deformation axes. The lower surface 13 of the structured part 11 and the free surface 31 of the support layer 30 here exhibit a roughness of less than or equal to about 10 nm RMS, propitious to the molecular bonding performed during a subsequent step. The respective dimensions of the central portion 40 and of the lateral portions 50 are such that the tensioner arms generate a tensile strain in the strained portion substantially equal to a predetermined value of deformation. In this example, the deformation of the strained portion 40 made of germanium is such that the energy band structure of the germanium becomes direct. In the subsequent description, the central portion 40 is called strained portion and the lateral portions 50 are called tensioner arms.

Subsequently, as illustrated in FIG. 1c, the suspended membrane 11, more precisely the strained portion 40 and at least one part of the tensioner arms 50, is placed in contact with the free surface 31 of the support layer. Hence, the structured part 11 is immersed in a liquid solution, for example of alcohol or of acidified deionized water (pH close to 2), and then the liquid is evaporated. During the evaporation phase, the suspended structured part 11 comes naturally into contact with the free surface 31 of the support layer. Thus, the structured part 11 rests on the support layer, so that the lower surface of at least a part of the tensioner arms 50 is in contact with the free surface 31 of the support layer. The lower surface of the strained portion 40 can be totally, partially, or not in contact with the free surface 31.

Figure 4:
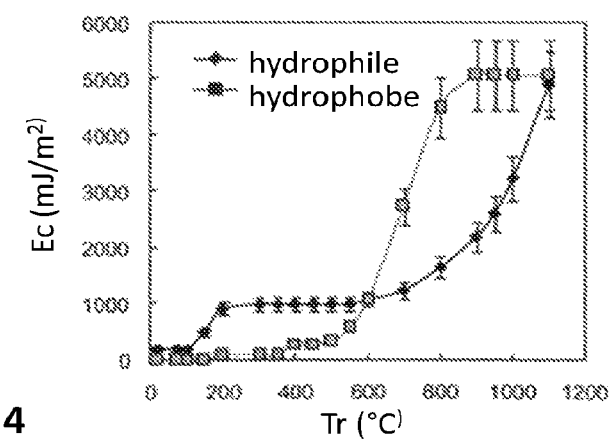
FIG. 4 illustrates an exemplary relation between the surface energy of hydrophilic and hydrophobic bonding between the structured part and the support layer as a function of an annealing temperature.

Placing these surfaces in contact ensures direct bonding, here of hydrophobic type, of the structured part 11 with the support layer 30. The direct bonding is here of hydrophobic type insofar as the surfaces are tied together by way of hydrogen bonds. At ambient temperature, as illustrated by FIG. 4 representing the evolution of the energy per unit area of hydrophobic bonding between the bonded surfaces, the hydrophobic bonding energy is here of the order of 5 mJ/m$^2$.

Placing in contact is understood to mean the contacting of the lower surface 13 of the structured part with the surface rendered free 31 of the support layer. These surfaces can be formed of the component material mainly making up the layers or of an insert material different from this main material. The semiconducting layer and the support layer can thus comprise a thin layer of an insert material obtained for example by deposition or by oxidation, preferably after formation of the cavity. In the method described here involving hydrophobic bonding, the semiconducting layer and the support layer does not comprise any insert material.

Thus, a structured part 11 of the semiconducting layer 10 is obtained, bonded on the free surface 31 of the support layer 30. The bonded structured part 11 comprises the strained portion 40 and a part of the tensioner arms 50. The unbonded part of the tensioner arms 50 is situated in the zone where the arms join up with the peripheral part 12 of the semiconducting layer 10, the latter resting on the unetched part of the sacrificial layer 20.

As a variant, the step of producing the cavity 21 and of placing the structured part 11 in contact with the free surface 31 of the support layer can be carried out at the same time. Hence, the cavity 21 is for example produced by wet etching with liquid HF or indeed with vapor HF at high pressure. In the case of HF vapor etching, the vapor flux can comprise hydrofluoric acid at 60 torr of partial pressure, alcohol at 0.1 torr and nitrogen at 75 torr. The gas flux then leads to a more significant etching speed than that mentioned previously, for example of the order of 100 nm/min, during a non-equilibrium etching reaction. Hence, drops of water and of hydrofluoric acid, products of the chemical reaction, form in the cavity and cause, by evaporating, the structured part to be placed in contact with the free surface of the support layer.

On completion of this step, the bonded structured part 11, formed of the strained portion 40 and of the tensioner arms 50 resting on the support layer 30, exhibits:

a bonding energy Ec, arising from the hydrophobic molecular bonding on the support layer. It can be estimated, to first order, through the relation:

$$E_c \approx E_s(S_{bt}+S_{pc})$$

where Es is the surface energy evaluated on the basis of the relation illustrated in FIG. 4, and $S_{bt}$ and $S_{pc}$ are the respective surface areas of the tensioner arms and of the strained portion. The bonding energy tends to stabilize the bonded structured part and to preclude any relaxation of the strains that might modify its mechanical resilience as well as its crystallographic structure, and therefore degrade its electrical and/or optical properties;

an elastic energy Ee, arising from the mechanical tensile strain related to the deformation of the portion strained by the tensioner arms. It can be estimated, to first order, through the relation:

$$E_e \approx eE(\overline{\epsilon}_{bt}^2 S_{bt}+\overline{\epsilon}_{pc}^2 S_{pc})$$

where e is the average thickness of the strained portion and of the tensioner arms, E the Young's modulus and $\overline{\epsilon}_{bt}$ the average value of deformation undergone by the tensioner arms and $\overline{\epsilon}_{pc}$ the average value of the deformation undergone by the strained portion. The elastic energy tends to destabilize the bonded strained part in such a way as to relax the strains naturally.

It may be noted that, to first order, the bonding energy comprises a predominant term related to the bonded area of the tensioner arms, this generally being greater than the bonded area of the strained portion. Moreover, the elastic energy comprises a predominant term related to the deformation of the strained portion, insofar as the tensioner arms exhibit an average deformation value close to the residual deformation value, the latter being less than the value of the deformation undergone by the strained portion.

With the aim of producing a semiconducting structure with strained portion, whose mechanical resilience and therefore electrical and/or optical properties are safeguarded, which can be separated from the peripheral part 12 of the semiconducting layer 10, the bonding energy must be greater than the elastic energy, this being manifested to first order by the following inequality:

$$E_s^{min}(S_{bt}^{min}+S_{pc}) > eE(\overline{\epsilon}_{bt}^2 S_{bt}^{min}+\overline{\epsilon}_{pc}^2 S_{pc})$$

Hence, according to the invention, we determine both the minimum value of bonding energy per unit area $E_s^{min}$ and the minimum value of bonded area $S_{bt}^{min}$ of the tensioner arms, that are necessary in order to satisfy this inequality. Of course, this inequality can be specified by using more detailed expressions for the bonding energy and for the elastic energy, for example by integrating the strain field throughout the volume of the bonded structured part.

Thus, by way of illustration, for a strained portion 40 of germanium with an area $S_{pc}$ of 5 µm² exhibiting a uniaxial average deformation of 5.7%, with a thickness e of 300 nm, the Young's modulus being equal to about 50 GPa, and the tensioner arms 50 exhibiting an average deformation close to the residual value of 0.2%, and finally for a bonding energy per unit area $E_s$ of 100 mJ/m², it emerges that the minimum bonded area $S_{bt}$ of the tensioner arms is equal to about 6550 µm². It is noted that by applying a thermal treatment at 600° C. for a few minutes to a few hours, the hydrophobic bonding energy per unit area $E_s$ goes to 1 J/m², thereby making it possible to obtain a minimum bonded area $S_{bt}^{min}$ of the tensioner arms of about 290 µm². Preferably, each of the two tensioner arms then exhibits a minimum bonded area $S_{bt}^{min}$ of 145 µm².

According to a third step, a strengthening of the molecular bonding of the structured part 11 tied to the free surface 31 of the support layer is performed in such a way as to obtain a value Es of bonding energy per unit area that is greater than or equal to the minimum value $E_s^{min}$ determined previously.

Hence, a thermal treatment is carried out, in the form of a consolidation annealing, in which the stack is subjected to an annealing temperature Tr for a few minutes to a few hours. By way of illustration, the annealing temperature can be 200° C. applied for 2 h, thereby increasing the hydrophobic bonding energy per unit area here from 5 mJ/m² to 100 mJ/m².

The annealing temperature lies between a minimum value which depends in particular on the bonded minimum area $S_{bt}^{min}$ of tensioner arms that one wishes to preserve, and a maximum value which depends in particular on the crystallographic quality to be safeguarded of the semiconducting layer. The maximum value of the annealing temperature can thus be lower than the epitaxial growth temperature of the semiconducting layer.

Thus, a structured part 11 is obtained, bonded to the support layer 30 with a bonding energy Ec whose value is greater than or equal to the predetermined minimum value. It is then possible to eliminate a part of the tensioner arms 50 so as to separate the structured part 11 from the peripheral part 12.

Figure 1D:
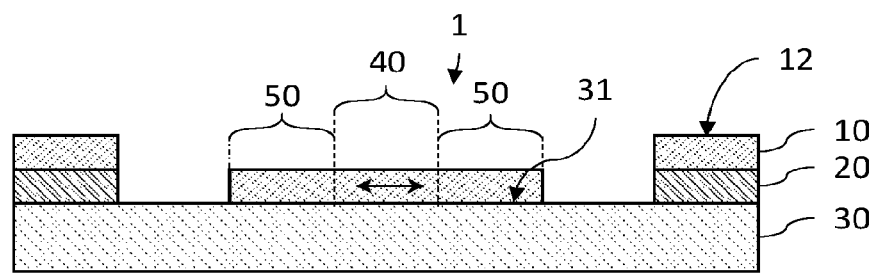

In a fourth step illustrated in FIGS. 1d, a distal portion 51 of the tensioner arms 50 is removed, by etching, so as to separate, or individualize, the structured part 11 in relation to the peripheral part 12 of the semiconducting layer 10.

To separate, render distinct or individualize, is understood to mean here that the structured part 11 is no longer linked to the peripheral part 12 by the tensioner arms 50. Moreover, distal portion 51 of the tensioner arms is understood to mean the zone of the tensioner arms 50 remote from the strained portion 40 and forming the join with the peripheral part 12 of the semiconducting layer.

The distal portion 51 of the tensioner arms is eliminated, by conventional operations of optical and/or electron lithography and of etching, in such a way that the bonded structured part 11 comprises a value of bonded area $S_{bt}$ of the tensioner arms that is greater than or equal to the minimum value $S_{bt}^{min}$ determined previously. Thus, the bonded area of the tensioner arms 50 is sufficient for the bonded structured part 11 to exhibit a greater bonding energy than its elastic energy.

Thus, a semiconducting structure 1 with strained portion 40 is obtained, bonded on the support layer 30 whose mechanical resilience is ensured, thus safeguarding its electrical and/or optical properties. The semiconducting structure 1 exhibits a high crystalline quality and the strained portion 40 a predetermined average deformation. It is tied to the support layer 30 by molecular bonding wherein the bonding energy and the bonded area of the tensioner arms 50 make it possible to freeze the strain field.

Figure 11:
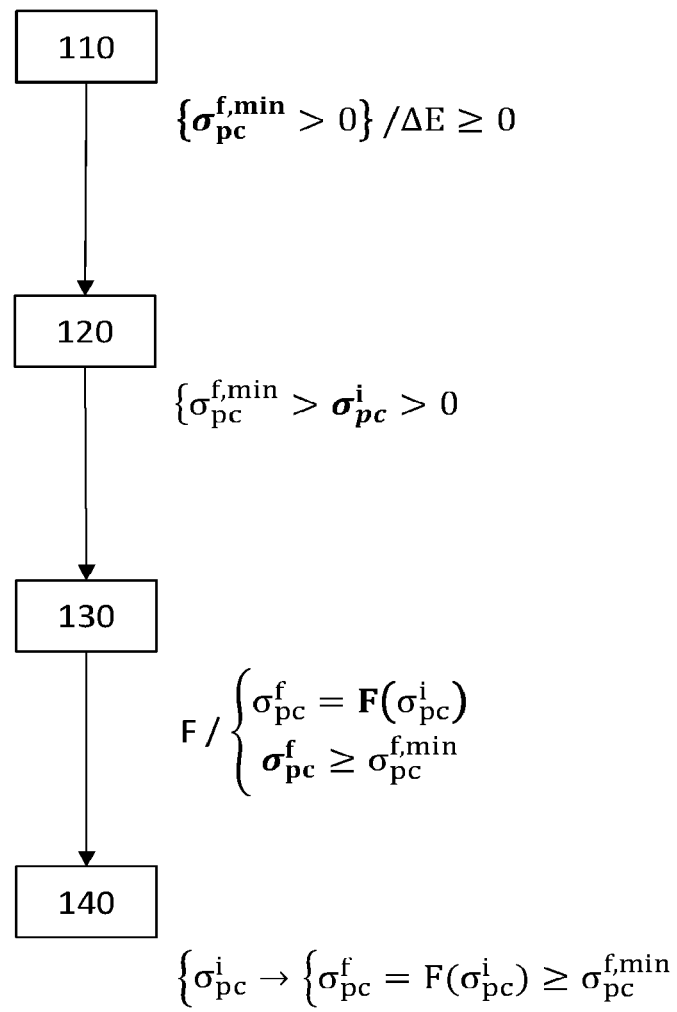
FIG. 11 is a flowchart of a method according to an embodiment making it possible to obtain a central portion of a semiconducting layer with direct band structure.

FIG. 11 illustrates a flowchart of a method according to a second embodiment, making it possible to obtain a central portion 40 of the semiconducting layer 10 with direct band structure.

During a first step 110, for the semiconducting layer 10, the minimum value $\sigma_{pc}^{f,min}$ of tensile strain making it possible to obtain a direct band structure is estimated, stated otherwise $\Delta E=E_{min,L}-E_{min,\Gamma}\geq 0$. The minimum value $\sigma_{pc}^{f,min}$ of tensile strain can be estimated on the basis of the article by Sukhdeo et al. entitled *Direct bandgap germanium-on-silicon inferred from 5.7% <100>uniaxial tensile strain*, Photon. Vol. 2, No. 3, A8, 2014 which illustrates an exemplary evolution of $\Delta E$ as a function of the value of the tensile strain of the semiconducting layer 10.

During a second step 120, the stack is provided, in which the semiconducting layer 10 then exhibits a tensile strain in the plane (X,Y) of non-zero and positive initial value $\sigma_{pc}^{i}$ but less than $\sigma_{pc}^{f,min}$. The semiconducting layer 10 then exhibits an indirect band structure $\Delta E<0$.

During a third step 130, a structuring of the semiconducting layer 10 is determined and then carried out in such a way as to form the structured part 11 described previously. The structuring is determined so that the formation of the subjacent cavity of the structured part 11 causes the increase in the tensile strain of the central portion 40, which then goes from the initial value $\sigma_{pc}^{i}$ to the final value $\sigma_{pc}^{f}$, the latter then being greater than or equal to $\sigma_{pc}^{f,min}$. Hence, the transfer function making it possible to go from $\sigma_{pc}^{i}$ to $\sigma_{pc}^{f}$ is denoted F, stated otherwise: $\sigma_{pc}^{f}=F(\sigma_{pc}^{i})$. The transfer function F is parametrized essentially by the dimensions of the structured part 11, and in particular by the average width of the tensioner arms 50 and that of the central portion 40. The transfer function can be identical or similar to the amplification factor f mentioned previously. The parameters of the transfer function F are therefore determined, for example by numerical simulation with the aid of the COMSOL Multiphysics software or by satisfying the relation mentioned previously.

During a fourth step 140, the cavity is formed under the structured part 11 by partial etching of the sacrificial layer 20. Thus, the central portion 40 goes from the initial value $\sigma_{pc}^{i}$ to the final value $\sigma_{pc}^{f}=F(\sigma_{pc}^{i})$ of strain in the plane (X,Y), the final value $\sigma_{pc}^{f}$ then being greater than or equal to $\sigma_{pc}^{f,min}$. A central layer 40 is thus obtained which exhibits a direct band structure $\Delta E\geq 0$.

Figure 2B:
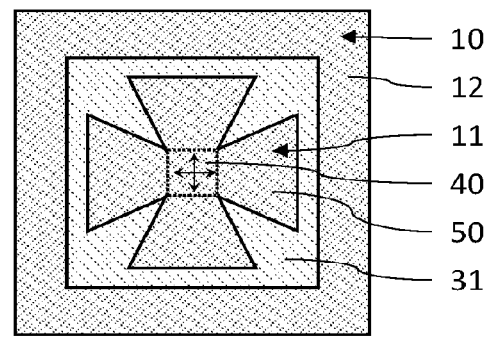
FIG. 2b illustrates the structured part separated from a peripheral part of the semiconducting layer.

FIGS. 2a and 2b illustrate two steps of the previously described method corresponding respectively to FIGS. 1c and 1d. In FIG. 2a is illustrated the structured part 11 bonded by molecular adhesion to the surface rendered free 31 of the support layer 30. The strained portion 40 is linked to the peripheral part 12 of the semiconducting layer by way of the tensioner arms 50. Two pairs of tensioner arms 50 of identical dimensions are represented, thereby inducing a biaxial deformation of the strained portion 40, of substantially equal intensity along the two deformation axes here respectively parallel to the axes X and Y. As a variant, each pair of tensioner arms can exhibit different dimensions, so as to deform the strained portion with a different intensity along each of the deformation axes. In FIG. 2b is illustrated the semiconducting structure 1 with strained portion 40, obtained by separating the structured part 11 from the peripheral part 12 of the semiconducting layer 10, by etching of the distal zone of the tensioner arms 50 joining with the peripheral part 12.

Figure 3B:
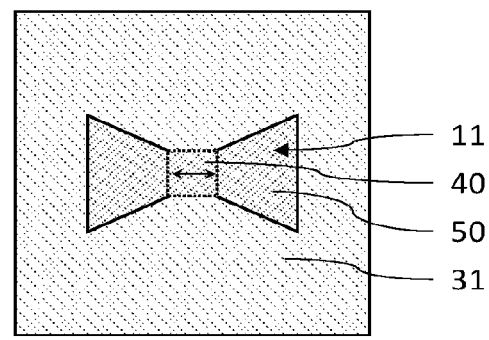
FIG. 3b illustrates the structured part separated from a peripheral part of the semiconducting layer.

FIGS. 3a and 3b are similar to FIGS. 2a and 2b and are distinguished therefrom essentially in that the structured part 11 comprises a single pair of tensioner arms 50 ensuring the uniaxial tensioning of the strained portion 40. The latter then undergoes a uniaxial deformation along the deformation axis defined by the arrangement of the tensioner arms 50 in relation to the strained portion 40. FIG. 3a illustrates the structured part 11 bonded by molecular adhesion to the surface rendered free 31 of the support layer 30, where the tensioner arms 50 link the strained portion 40 to the peripheral part 12 of the semiconducting layer. FIG. 3b illustrates the semiconducting structure 1 obtained on the basis of the bonded structured part 11 by etching the zone joining the tensioner arms 50 to the peripheral part (the latter also being eliminated).

FIG. 4 illustrates an exemplary relation between the bonding energy per unit area between a germanium surface and a silicon surface as a function of the annealing temperature, in the case of a bonding of hydrophilic type and of a bonding of hydrophobic type. Up to about 600° C., the bonding energy per unit area exhibits a lower value in the hydrophobic case than in the hydrophilic case. The trend reverses thereafter from about 600° C. onward. Moreover, in the hydrophilic case, the energy per unit area increases as soon as an annealing at about 100° C. is applied, and the energy goes from of the order of 100 mJ/m² at ambient temperature to 1 J/m² after an annealing at about 200° C. In the hydrophobic case, the energy goes from of the order of 5 mJ/m² at ambient temperature to 100 mJ/m² after an annealing at about 200° C.

FIGS. 5a to 5e illustrate a method for producing the semiconducting structure with strained portion according to a second embodiment. This method is distinguished from the first embodiment essentially in that the molecular bonding is of hydrophilic type.

FIG. 5a illustrates the provision of a stack formed of a semiconducting layer 10 tied to a support layer 30 by a sacrificial layer 20, and then the structuring of the semiconducting layer 10 so as to form a structured part 11 and a peripheral part 12, the structured part 11 comprising a central portion 40 linked to the peripheral part 12 by way of at least one pair of lateral portions 50 (cf. for example FIG. 5b, 2a or 3a). These steps are identical to those described with reference to FIG. 1a and 2a or 3a, and are not detailed here further.

FIG. 5b illustrates the production of a cavity 21 situated under the structured part 11, so as to suspend the structured part 11 above a surface rendered free 31 of the support layer 30. As mentioned previously, the cavity 21 can be produced by wet etching of the sacrificial layer 20 rendered accessible by openings obtained during the structuring of the semiconducting layer 10. Here the wet etching uses hydrofluoric acid HF in the vapor phase. The HF vapor flux can be low so as to etch the sacrificial layer at a moderate speed of the order of 10 nm per minute. More precisely, the vapor flux can, by way of example, comprise hydrofluoric acid at 15 torr of partial pressure, alcohol at 0.01 torr and nitrogen at 60 torr. Thus, the part of the sacrificial layer 20 situated under the structured part 11 is etched over its entire thickness. The structured part 11 is then suspended above the surface rendered free 31 of the support layer, thus forming a cavity 21.

As a variant, the surface 31 of the support layer can be formed of an upper layer (not represented) made of a thermal oxide, that is to say obtained by thermal oxidation. The speed of HF wet etching of the sacrificial layer 20, when the latter is made of a deposited oxide, is greater than that of the upper layer of thermal oxide. Thus, during the step of producing the cavity 21, the sacrificial layer is eliminated at the level of the structured part 11 and the upper face 31 of the thermal oxide layer is then rendered free. It is thus possible to control the thickness of the oxide layer separating the semiconducting structure 1 in relation to the support layer 30. As a variant, the sacrificial layer can comprise a deposited oxide sub-layer, in contact with the semiconducting germanium layer 10, and a subjacent thermal oxide sub-layer, situated between the deposited oxide sub-layer and the silicon support layer 30, the sub-layers advantageously being separated by a thin etching barrier layer.

FIG. 5c illustrates a step of surface treatment of the structured part 11 and of the free surface 31 of the support layer, with the aim of subsequently ensuring the hydrophilic molecular bonding of these elements. During this step, the surface 13 of the structured part 11 facing the cavity 21 and the free surface 31 of the support layer are treated so that they are each formed of a thin layer 14, 15 of oxide or of nitride, of a thickness of a few nanometers to a few tens of nanometers.

According to a variant, the structured part 11 and the support layer 30 are covered, at the level of the cavity 21, with a thin oxide layer 14, 15 produced by oxidation. The thin oxide layers 14, 15 can be obtained by placing this zone of the stack in the open air for a sufficient duration, for example 1 h. They can also be obtained by an $O_3$ plasma oxidation technique, for example at ambient temperature, or indeed by an $O_2$ plasma oxidation technique, for example at a temperature of 250° C. Within the framework of the preferred example, the monocrystalline germanium structured part exhibits a lower surface 13 formed of a thin germanium oxide layer 14 with a thickness of the order of a few nanometers to a few tens of nanometers, and the free surface 31 of the silicon support layer is formed of a thin silicon oxide layer 15 with a thickness also of the order of a few nanometers to a few tens of nanometers.

According to another variant, the structured part 11 and the support layer 30 are covered, at the level of the cavity 21, with a thin oxide or nitride layer obtained by a thin film deposition technique. The layers are, for example, deposited by a technique of the ALD (for Atomic Layer Deposition) type, plasma assisted or not.

The deposited material can be a silicon oxide or nitride, $SiO_2$ or $Si_3N_4$, or indeed be a hafnium oxide $HfO_2$, a titanium oxide $TiO_2$, or indeed an aluminum oxide $Al_2O_3$, or any other suitable material. Thus, within the framework of the preferred example, the structured part 11 made of monocrystalline germanium exhibits a lower surface 13 formed of a thin layer, for example, of silicon oxide with a thickness of the order of a few tens of nanometers, and the free surface 31 of the silicon support layer 30 is formed of a thin silicon oxide layer with a thickness also of the order of a few tens of nanometers.

As described previously, a suspended structured part 11 is thus obtained, which takes the form of a suspended membrane, whose lateral portions 50 form tensioner arms that maintain the central portion 40 above the free surface 31 of the support layer and generate in the central portion 40 a tensile mechanical strain oriented along the deformation axes. The lower surface 13 of the structured part and the free surface 31 of the support layer here exhibit a roughness of less than or equal to about 10 nm RMS, propitious to the molecular bonding performed during a subsequent step.

FIG. 5d illustrates the step of placing the structured part 11 in contact with the free surface 31 of the support layer. Hence, the suspended structured part 11 is immersed in a liquid solution, for example of alcohol or of acidified deionized water (pH close to 2), and then the liquid is evaporated. Preferably, the structured part 11 is immersed in a liquid solution of nitrogen (for example at a temperature of about 70K) or of helium (for example at a temperature of about 4K), and then the liquid is evaporated. During the immersion or evaporation phase, the suspended membrane 11 comes naturally into contact with the free surface 31 of the support layer. The use of helium or of nitrogen (or of any other appropriate liquid), therefore associated with a decrease in the temperature prior to placing the structured part 11 in contact with the support layer 30, makes it possible to generate a more significant tensioning of the structured part 11. Thus, the structured part 11 rests on the support layer 30, so that the lower surface of at least one part of the tensioner arms 50 is in contact with the free surface 31 of the support layer. The lower surface of the strained portion 40 can be in contact totally, partially, or indeed not be in contact with the free surface 31.

Placing these surfaces in contact ensures direct bonding of hydrophilic type of the structured semiconductor part on the support layer. At ambient temperature, as illustrated by FIG. 4, the hydrophilic bonding energy is here of the order of 100 mJ/m².

Here, placing in contact corresponds to contacting the lower surface 13 of the structured part with the free surface 31 of the support layer, these surfaces being formed of the thin layer 14, 15 obtained by oxidation or by deposition. Thus, a layer 14, 15 of an insert material is present between the component material mainly making up the structured part 11 and the component material mainly making up the support layer 30. This so-called insert layer 14, 15 exhibits a thickness of the order of a few tens of nanometers to one or more hundred nanometers. It is advantageously dielectric and can thus ensure the electrical insulation of the strained portion in relation to the support layer.

A step of determining the minimum value of bonding energy per unit area $E_s^{min}$, here hydrophilic, and the minimum value of bonded area $S_{bt}^{min}$ of the tensioner arms, necessary so that the hydrophilic bonding energy of the structured part is greater than the elastic energy of this same structured part, is performed thereafter.

Thus, by way of illustration, for a strained germanium portion with area $S_{pc}$ of 5 µm² exhibiting a uniaxial average deformation of 5.7%, with thickness e of 300 nm, the Young's modulus being equal to about 100 GPa, and the tensioner arms exhibiting an average deformation close to the residual value of 0.2%, and finally for a hydrophilic bonding energy per unit area $E_s$ of 1 J/m², the minimum bonded area $S_{bt}^{min}$ of the tensioner arms is about 290 µm².

A step of strengthening the molecular bonding of the structured part 11 tied to the free surface 31 of the support layer is performed thereafter, so as to obtain a value Es of hydrophilic bonding energy per unit area that is greater than or equal to the minimum value $E_s^{min}$ determined previously. Hence, a thermal treatment is carried out, in the form of a consolidation annealing, in which the stack is subjected to an annealing temperature Tr for a few minutes to a few hours. By way of illustration, the annealing temperature can be 200° C. applied for 2 h, thereby increasing the hydrophilic bonding energy per unit area here from 100 mJ/m² to 1 J/m².

With reference to FIG. 5e, a distal portion of the tensioner arms is removed, by etching, so as to individualize the structured part in relation to the peripheral part of the semiconducting layer. This step is similar to the step described previously with reference to FIG. 1d and is not detailed further here.

Thus, a semiconducting structure 1 with strained portion 40 is obtained, bonded by hydrophilic molecular adhesion on the support layer 30, whose mechanical resilience is ensured and electrical and/or optical properties safeguarded. The method according to the second embodiment is therefore distinguished from the first embodiment essentially by the hydrophilic bonding, whose intensity is greater than that of the hydrophobic bonding up to annealing temperatures of the order of 500° C. to 600° C., and by the presence of a layer 14, 15 of an insert oxide or nitride at the interface between the structured part 11 and the support layer 30, whose dielectric property ensures electrical insulation between these elements. This insert material, in addition to a function of electrical insulation, can also ensure a function of evacuation of the heat possibly produced at the level of the strained portion, in the case where the latter forms an emissive layer of a luminous source.

The strained portion 40 of the semiconducting structure 1 can be formed of an intrinsic material (not intentionally doped) or an intentionally doped material, according to the desired electronic and/or optical applications and the desired deformation intensity. By way of illustration, to obtain a strained portion 40 made of not intentionally doped monocrystalline germanium exhibiting a substantially direct energy band structure, the required deformation is of the order of 5.6% in the case of a uniaxial deformation and of the order of 2.0% in the case of a biaxial deformation. The intensity of the deformation is decreased in the case where the germanium is doped. Thus, for a doping level of $2.10^{18} cm^{-3}$, the required deformation is of the order of 4.1% in the case of a uniaxial deformation, and of the order of 1.5% in the case of a biaxial deformation.

In an advantageous manner, a plurality of semiconducting structures 1 can be produced simultaneously starting from the same semiconducting layer 10. The semiconducting structures are then adjacent and separate from one another. Thus, each semiconducting structure is distinct from its neighbors, that is to say not attached to the corresponding peripheral part of the same semiconducting layer.

FIGS. 6 and 7a to 7c illustrate an exemplary variant of semiconducting structure 1 obtained by the method according to the first or second embodiment, in which reinforcement elements 61 are disposed at the level of the strained portion 40, for example in, or on the boundary of, the latter.

Figure 6:
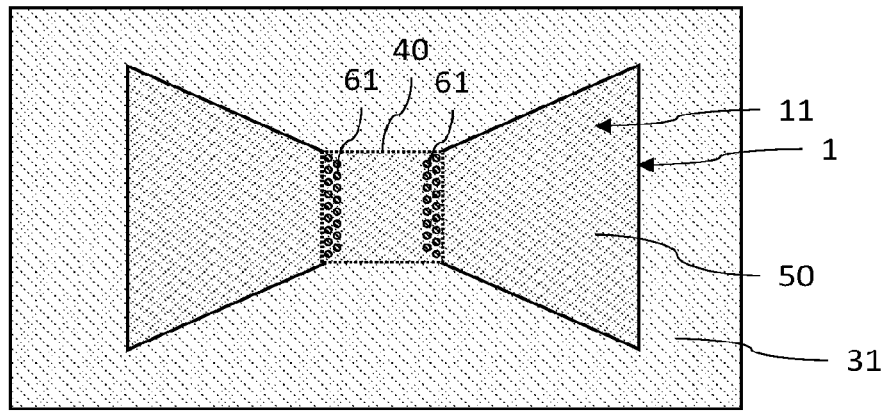
FIGS. 6 and 7a to 7c illustrate in a schematic manner an exemplary semiconducting structure comprising reinforcement elements, FIG. 6 representing such a structure viewed from above

In FIG. 6, the semiconducting structure 1 is schematically represented viewed from above. It is here similar to that represented in FIG. 3b and is therefore not described in detail. It is nonetheless distinguished therefrom by the presence of at least one reinforcement element 61, here a plurality of elements, disposed at the level of the strained portion 40, each being suitable for locally decreasing the elastic energy of the semiconducting structure 1 without however substantially decreasing the average deformation of the strained portion 40, and thus helping to ensure the mechanical resilience of the latter.

More precisely, in this example, the reinforcement elements 61 take the form of an etched zone 62 passing through the strained portion 40 over its entire thickness and continuing into a part of the support layer 30, filled with a material distinct from that which is the main component making up the strained portion. The reinforcement elements 61 thus extend, in a manner substantially orthogonal to the plane (X,Y), along the thickness direction of the strained layer.

The reinforcement elements 61 are disposed here in the strained portion 40, that is to say that they are each surrounded by the material forming the strained portion, and are situated here at the level of the boundary forming the join between the strained portion 40 and the tensioner arms 50.

In this example, the reinforcement elements 61 each exhibit a profile in the plane (X,Y) of circular shape, but other profiles are possible, for example of elongate, oblong, polygonal or other shape. The reinforcement material is distinct from that of the strained portion, and therefore exhibits different mechanical properties that may strengthen the mechanical resilience of the semiconducting structure. It is chosen here from among an oxide or a nitride, for example of silicon.

Moreover, as represented in this example, the reinforcement elements 61 can exhibit an optical function, for example form a Bragg mirror. Thus, two Bragg mirrors are formed on either side of the strained portion 40 in such a way as to form an optical cavity in which the strained portion 40 is able to form a gain medium of a coherent light emission source.

Figure 7A:
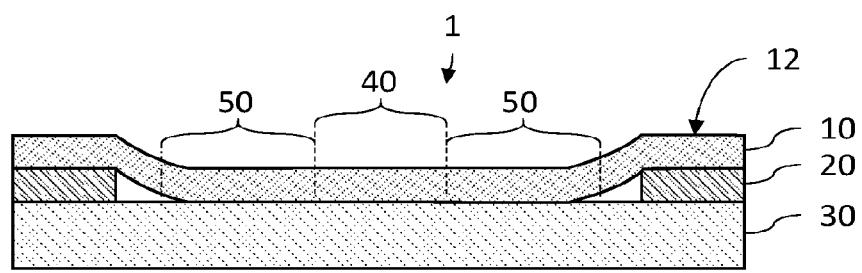
Figure 7B:
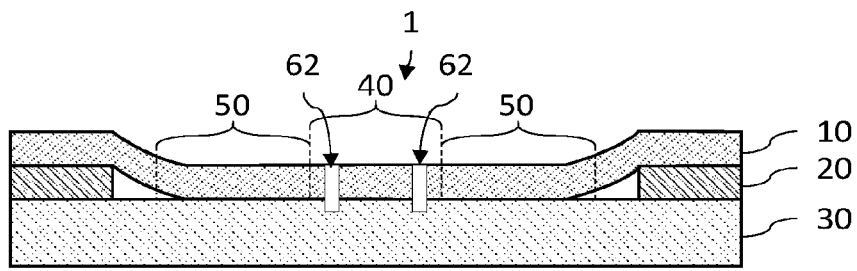
Figure 7C:
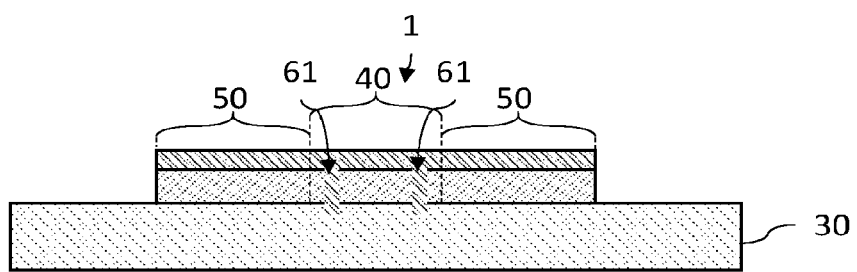

FIGS. 7a to 7c illustrate in a schematic manner various steps of producing the reinforcement elements. FIG. 7a illustrates a semiconducting structure 1, here obtained on the basis of the method of production according to the first mode described previously, where a strained germanium portion 40 is bonded by hydrophobic molecular adhesion on the support layer 30. At least one etched zone 62 (two zones are represented) is produced thereafter, which passes through the strained portion 40 over its entire thickness and extends into a part of the support layer 30 (FIG. 7b). The etched zones 62 are thereafter filled with a reinforcement material, here a silicon oxide, which fills at least in part, and preferably totally, the etched zones. The reinforcement material can also cover the semiconducting structure 1 in the form of an encapsulation layer. The distal part of the lateral portions 50 is thereafter eliminated (FIG. 7c).

As a variant (not represented), the etched zones 62 are produced during the step illustrated in FIG. 1a of structuring the semiconducting layer 10 so as to form the structured part 11 comprising the central portion 40 and the lateral portions 50, therefore prior to the step of placing the structured part 11 in contact with the free surface of the layer 30.

As a variant, other arrangements of the reinforcement elements are possible. For example, the etched zones of the strained portion can be disposed at the level of the lateral boundaries of the strained portion, substantially parallel to the deformation axis, so as to also ensure an optical function. Thus, as a variant to the example of FIG. 6, the two lateral boundaries can be etched according to a predefined period, and then the etched zones filled with a material different from that forming the strained portion and exhibiting a contrast of optical index with the latter. Thus, each lateral boundary forms an array in which a defect of period may be present so as to form a $\lambda/4$, cavity, where $\lambda$ is the emission wavelength of the light source comprising a strained portion with lateral structurings such as this. Thus, the reinforcement elements here form an optical cavity of DFB (Distributed Feedback Laser) type.

The production of various optoelectronic devices comprising the semiconducting structure 1 with strained portion obtained by the method according to the first or second embodiment described previously is now described. By way of illustration, the optoelectronic devices described subsequently comprise a monocrystalline germanium semiconducting structure bonded to a silicon support layer.

Figure 8A:
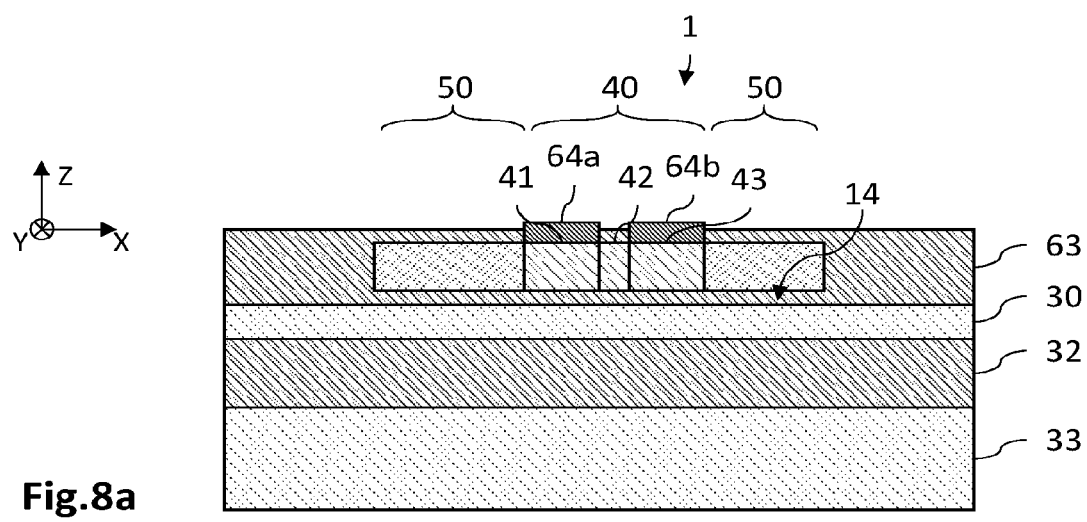
FIGS. 8a and 8b illustrate in a schematic manner and in sectional view two examples of optoelectronic device comprising a semiconducting structure obtained by the method according to the invention, the optoelectronic device here being a light-emitting diode comprising a PIN junction oriented in a vertical (FIG. 8a) or horizontal (FIG. 8b) manner.
Figure 8B:
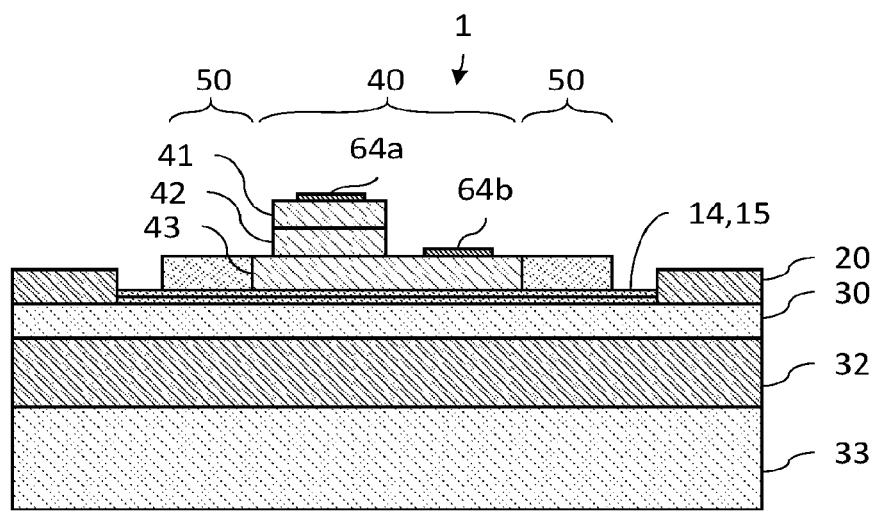

FIGS. 8a and 8b represent in a schematic manner a sectional view of two examples of an optoelectronic device with incoherent light emission. More precisely, here the optoelectronic device is a light-emitting diode.

In FIG. 8a, the light-emitting diode here comprises a semiconducting structure 1 obtained by the method of production according to the second embodiment, that is to say involving hydrophilic molecular bonding.

The germanium semiconducting structure 1 comprises a strained portion 40 placed under tension by tensioner arms 50. It is tied to the support layer 30 by hydrophilic molecular bonding, this being manifested by the presence of an insert material 14, here a silicon oxide, situated at the interface between the germanium of the semiconducting structure 1 and the silicon of the support layer 30. The support layer is here a silicon upper layer of a substrate of SOI type. It rests on an oxide layer 32 situated between the support layer 30 and a thick lower layer 33 of silicon.

The semiconducting structure 1 furthermore comprises an encapsulation layer 63 which covers the strained portion 40 and the tensioner arms 50. The strained portion 40 comprises a PIN junction produced by implantation of dopants (phosphorus and boron, in the case of germanium) so as to form an N-doped zone 41 neighboring a P-doped zone 43. Here, an intrinsic (not intentionally doped) zone 42 separates the N- and P-doped zones 41, 43. The PIN junction extends in a substantially vertical manner across the strained portion 40, in the direction of the support layer. Moreover, two pads 64a, 64b of an electrically conducting material are present at the level of the doped zones 41, 43, forming electrical contacts.

By way of example, the germanium semiconducting structure of the diode exhibits an average thickness of 300 nm. The strained portion exhibits a bonded area of the order of a few square microns, for example 1 $\mu m^2$, and a biaxial average deformation of about 2%. The tensioner arms exhibit a bonded minimum area of the order of 305 $\mu m^2$. The semiconducting structure is tied by hydrophilic molecular bonding of a minimum value of 1 $J/m^2$ obtained subsequent to a consolidation annealing at a temperature of about 200° C. for a sufficient duration of a few minutes to a few hours.

The light-emitting diode can be obtained in the following manner. The semiconducting structure is produced firstly by the method according to the second embodiment, and then the doped zones are produced by implantation of impurities, for example phosphorus and boron in the case of germanium. The electrical contacts are produced thereafter. An encapsulation layer is deposited thereafter and then leveled flat by a chemical mechanical polishing technique CMP and then etched locally so as to render the electrical contacts accessible.

FIG. 8b illustrates a variant of the light-emitting diode illustrated in FIG. 5a, which is distinguished therefrom essentially in that a PIN junction extends in a manner substantially parallel to the plane of the support layer.

The strained portion 40 is structured in its thickness, in such a way as to exhibit a lower part 43 doped according to a first type of conductivity, here of type P, resting on the support layer 30. This P-doped part 43 is linked to the tensioner arms 50 and exhibits an average thickness substantially identical to that of the arms. On the P-doped lower part rests an upper part 41 doped according to a second type of conductivity, here of type N. An intrinsic part 42 is situated between the N-doped upper part 41 and the P-doped lower part 43, and here exhibits dimensions in the plane (X,Y) that are substantially identical to those of the upper part 41. Thus, the P- and N-doped parts and the intrinsic part together form a PIN junction which extends in a plane substantially parallel to the plane (X,Y). Two pads 64a, 64b of an electrically conducting material, forming electrical contacts, are disposed on the N-doped upper part 41 and on a free zone of the P-doped lower part 43.

By way of example, the lower part of the strained portion exhibits a thickness of the order of 200 nm, and a doping level of the order of $2.10^{18}$ cm$^{-3}$. The intrinsic part exhibits a thickness here of the order of 100 nm and the upper part a thickness of the order of 200 nm and a doping level of the order of $2.10^{18}$ cm$^{-3}$. The lower part of the strained portion exhibits a bonded area of the order of a few square microns, for example 1 $\mu m^2$, and the strained portion exhibits a biaxial average deformation of about 2%. The tensioner arms exhibit a bonded area of the order of 300 $\mu m^2$. The semiconducting structure is tied by hydrophilic molecular bonding of a minimum value of 1 $J/m^2$ obtained subsequent to a consolidation annealing at a temperature of about 200° C. for a sufficient duration of a few minutes to a few hours.

The doped parts of the semiconducting structure may have been produced during the epitaxial growth of the germanium semiconducting layer when obtaining the stack such as represented in FIG. 1a. Alternatively, they can be obtained after production of the semiconducting structure by steps of implanting dopant impurities at various depths.

Figure 9A:
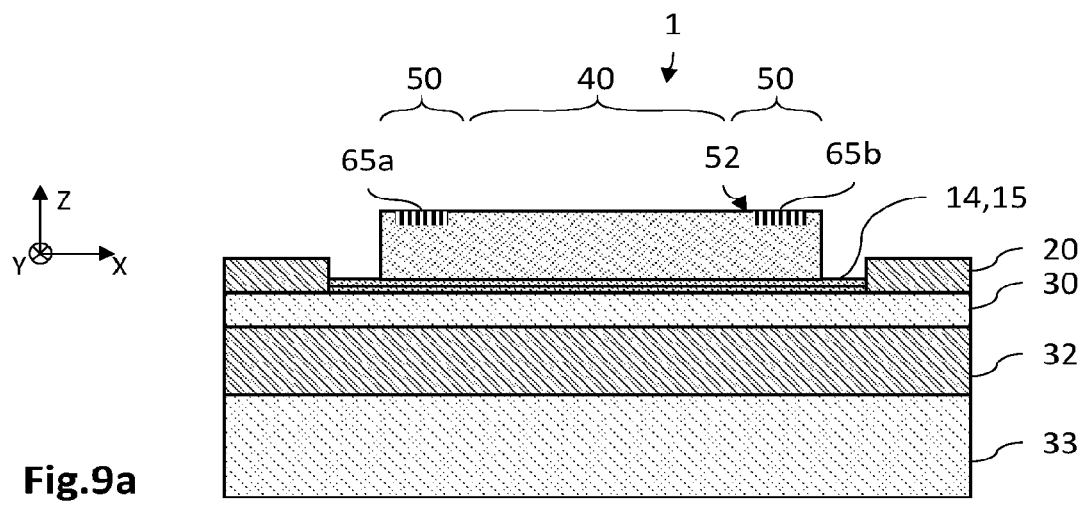
FIGS. 9a and 9b illustrate in a schematic manner and in sectional view two examples of optoelectronic device comprising a semiconducting structure obtained by the method according to the invention, the optoelectronic device here being a laser source where an optical cavity is produced in the semiconducting structure, the strained portion comprising a PIN junction (FIG. 9b) or otherwise (FIG. 9a)
Figure 9B:
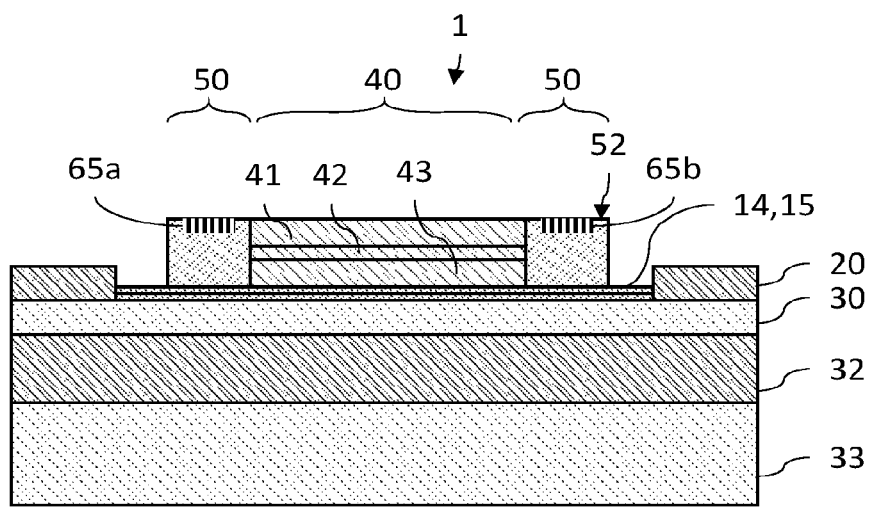

FIGS. 9a and 9b represent in a schematic manner a sectional view of the examples of an optoelectronic device with coherent light emission. More precisely, the optoelectronic device is here a laser source with optical or electrical pumping.

In FIG. 9a, the laser source here comprises a semiconducting structure 1 obtained by the method of production according to the second embodiment, that is to say involving hydrophilic molecular bonding. The laser source here comprises a semiconducting structure 1 formed of a strained portion 40 placed under tension by tensioner arms 50, and tied to the support layer 30 by hydrophilic molecular bonding, this being manifested by the presence of an insert material 14, 15 situated at the interface between the material of the semiconducting structure 1 and that of the support layer 30. Here the semiconducting structure is made of germanium and here the support layer is a silicon upper layer of a substrate of SOI type. It rests on an oxide layer 32 situated between the support layer and a thick lower layer 33 of silicon. The insert material can be a silicon oxide.

Here the germanium of the semiconducting structure is intrinsic or indeed doped, and an optical cavity is produced inside which is situated the strained portion 40, which here forms a gain medium able to emit light. Hence, and by way of illustration, two Bragg mirrors 65a, 65b are disposed on the upper face 52 of the tensioner arms 50, preferably in a zone where the deformation of the tensioner arms is substantially equal to the residual value.

By way of example, the germanium semiconducting structure of the laser source exhibits an average thickness of 300 nm. The strained portion exhibits a bonded area of the order of a few square microns, for example 5 $\mu m^2$, and a uniaxial average deformation of about 5.7%. The tensioner arms exhibit a bonded minimum area of the order of 260 $\mu m^2$. The semiconducting structure is tied by hydrophilic molecular bonding of a minimum value of 1 $J/m^2$ obtained subsequent to a consolidation annealing at a temperature of about 200° C. for a sufficient duration of a few minutes to a few hours.

The partial removal of material forming the lateral portions 50 during the production of the Bragg mirrors 65a, 65b can be taken into account during the step of prior determining of the minimum value of bonding energy per unit area $E_s^{min}$ and the minimum value of bonded area $S_{bt}^{min}$ of the tensioner arms.

FIG. 9b illustrates a variant of the light-emitting diode illustrated in FIG. 7a, which is distinguished therefrom essentially in that a PIN junction extends in a manner substantially parallel to the plane of the support layer in the strained portion. The strained portion 40 here comprises a stack of a first lower part 43, situated in proximity to the support layer 30, doped according to a first type of conductivity, for example of type P, covered with an intrinsic intermediate part 42, itself covered with a part 41 doped according to a second type of conductivity opposite to the first type, for example of type N. An optical cavity, similar to that described with reference to FIG. 7a, is produced at the level of the upper face 52 of the tensioner arms 50. Moreover, two electrical contacts (not represented) are devised to be in contact one with the N-doped upper part and the other with the P-doped lower part. Here also, the partial removal of material forming the lateral portions 50 during the production of the Bragg mirrors 65a, 65b can be taken into account during the step of prior determining of the minimum value of bonding energy per unit area $E_s^{min}$ and the minimum value of bonded area $S_{bt}^{min}$ of the tensioner arms.

FIGS. 10a to 10f represent in a schematic manner in sectional view various steps of an exemplary method for producing a laser source in which the optical cavity is produced at the level of the support layer.

In this example, a layer 2 of a semiconducting material, here germanium, is produced, for example by RP-CVD (for reduced pressure chemical vapor deposition) epitaxy, on a silicon substrate 3 (FIG. 10a). The germanium layer is thereafter covered with an oxide layer 4 and then H+ ions are implanted in the germanium layer (dotted line in FIG. 10b).

A silicon layer intended to form the support layer 30 is produced thereafter, here in the form of an SOI substrate, in which are produced, at the level of its surface 31, two Bragg mirrors 65a, 65b (or equivalent optical elements) intended to form an optical cavity. The surface 31 of the support layer is thereafter covered with an oxide layer.

The SOI substrate is tied to the surface of the oxide layer 4 (FIG. 10c). The breakage of the germanium layer 2 is performed at the level of the ion implantation zone and a stack of a germanium semiconducting layer 10 bound to a silicon support layer 30 by way of a sacrificial layer 20 made of silicon oxide is thus obtained. The two Bragg mirrors 65a, 65b are buried in the support layer 30 at the level of the interface with the sacrificial layer 20 (FIG. 10d).

A semiconducting structure 1 is thereafter obtained on the basis of the method according to the second embodiment. The Bragg mirrors 65a, 65b are thus disposed facing the tensioner arms 50, or indeed facing the strained portion 40, and enframe the strained portion 40 so as to form an optical cavity (FIG. 10e). An encapsulation layer 63, made for example of silicon oxide, which covers the semiconducting structure 1 is deposited thereafter. Finally a PIN junction 41, 42, 43 is produced and then electrical contacts 64a, 64b are produced in a manner similar to that described with reference to FIG. 6a (FIG. 10f). Moreover, the support layer may have been previously structured in such a way as to form the core of a waveguide surrounded by a sheath formed by the silicon oxide, the core extends substantially facing the strained portion.

Particular embodiments have just been described. Alternative variants and various modifications will be apparent to the person skilled in the art.

Thus, the optoelectronic devices described previously are described solely by way of illustration. Other optoelectronic devices can be produced, for example optically or electrically pumped laser sources, with PN, PIN junctions, or not, or indeed light-emitting diodes or photodetectors.

The invention claimed is:

1. A method of production of a semiconducting structure comprising a strained portion tied to a support layer by molecular bonding, comprising the steps of:
   i. providing a stack, formed of a semiconducting layer covering a sacrificial layer disposed on a support layer;
   ii. structuring the semiconducting layer in such a way as to form a structured part and a peripheral part, the structured part comprising a central portion linked to the peripheral part by at least two lateral portions opposite one another in relation to the central portion;
   iii. producing a cavity situated under the structured part, by etching of the sacrificial layer, so as to render free a surface of the support layer situated at the level of the cavity and to strain the central portion, termed the strained portion, by the lateral portions, and placing the structured part in contact with said free surface so as to bind the structured part of said free surface by molecular bonding;
   iv. determining a minimum value of molecular bonding energy of the structured part on the support layer, together with a minimum value of bonded area of the lateral portions on the support layer, these minimum values being such that said molecular bonding energy is greater than an elastic energy of the structured part;
   v. performing a consolidation annealing at an annealing temperature such that the molecular bonding energy exhibits a value greater than or equal to said previously determined minimum value;
   vi. etching a distal part of the lateral portions in relation to the strained portion, so that the bonded area of the lateral portions exhibits a value greater than or equal to said previously determined minimum value, thus obtaining said semiconducting structure.

2. The method of production as claimed in claim 1, in which, during step vi, a distal part of the lateral portions joining with the peripheral part of the semiconducting layer is etched.

3. The method of production as claimed in claim 1, in which, subsequent to step vi, the semiconducting structure exhibits a substantially plane upper face opposite to the support layer.

4. The method of production as claimed in claim 1, furthermore comprising the steps of:
   prior to step i) of provision, estimating a minimum value ($\sigma_{pc}^{f,min}$) of tensile strain from which the semiconducting layer exhibits a direct energy band structure ($\Delta E \geq 0$);
   providing said stack, the semiconducting layer exhibiting an initial value ($\sigma_{pc}^{i}$) lower than said minimum value ($\sigma_{pc}^{f,min}$)
   determinating the structuring so that, after step iii) of producing the cavity, the central portion exhibits a final value ($\sigma_{pc}^{f}$) of tensile strain greater than or equal to said minimum value ($\sigma_{pc}^{f,min}$) and therefore a direct energy band structure ($\Delta E \geq 0$).

5. The method of production as claimed in claim 1, in which, during the provision step, the semiconducting layer exhibits a tensile strain of a non-zero initial value ($\sigma_{pc}^{i}$) and, during the structuring step, the lateral portions exhibit a greater average width than an average width of the central portion.

6. The method of production as claimed in claim 1, in which, during step iii, the cavity is produced and contact is carried out by HF vapor-phase etching optionally followed by the deposition and then the evaporation of a liquid at the level of the cavity, and in which, during step v the annealing temperature is substantially greater than or equal to 200° C.

7. The method of production as claimed in claim 1, in which, during step iii, an oxidation or a nitriding of said free surface and of a surface of the structured part oriented toward the free surface is carried out, and in which, during step v, the annealing temperature is substantially greater than or equal to 100° C.

8. The method of production as claimed in claim 7, in which a dielectric layer arising from said oxidation or nitriding is formed at the interface between the structured part and the support layer, whose thickness is preferably greater than or equal to 10 nm.

9. The method of production as claimed in claim 1, in which, during step ii, the lateral portions are structured so that, during step iii, the strained portion exhibits a uniaxial or biaxial deformation.

10. The method of production as claimed in claim 1, in which the strained portion comprises at least one doped part with a doping level of greater than or equal to $2.10^{18}$ cm$^{-3}$.

11. The method of production as claimed in claim 1, in which, at least one reinforcement element is produced situated at the level of the strained portion, said reinforcement element comprising a material distinct from the material forming the strained portion, and extending over the entire thickness of the strained portion and in a part of the support layer.

12. A method of collective production of a plurality of mutually distinct and adjacent semiconducting structures, in which said semiconducting structures are produced in a simultaneous manner by the method of production as claimed in claim 1, and in which each semiconducting structure is separated from the corresponding peripheral part.

13. A method for producing an optoelectronic device, said device comprising a semiconducting structure obtained by the method as claimed in claim 1, in which a PN or PIN junction, is produced in the strained portion, the junction extending in a manner substantially orthogonal or parallel to the plane of the support layer.

14. A method for producing an optoelectronic device, said device comprising a semiconducting structure obtained by the method as claimed in claim 1, in which an optical cavity is produced in which is situated at least one part of the strained portion whose material is suitable for forming a gain medium, the device obtained being suitable for emitting a coherent light beam.

15. The method for producing an optoelectronic device as claimed in claim 14, in which at least two reflector optical elements suitable for forming the optical cavity are produced, the optical elements being disposed at the level of an upper face of the semiconducting structure opposite to the support layer, or in which at least two reflector optical elements suitable for forming the optical cavity are produced, the optical elements being disposed at the level of the free surface of the support layer.

\* \* \* \* \*